(12) United States Patent
Vester

(10) Patent No.: US 6,768,302 B2
(45) Date of Patent: Jul. 27, 2004

(54) MAGNETIC RESONANCE SIGNAL EVALUATION METHOD AND APPARATUS USING COMBINATIONS OF SIMULTANEOUSLY RECEIVED ANTENNA SIGNALS

(75) Inventor: Markus Vester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/255,384

(22) Filed: Sep. 26, 2002

(65) Prior Publication Data

US 2003/0062894 A1 Apr. 3, 2003

(30) Foreign Application Priority Data

Oct. 1, 2001 (DE) .......................................... 101 48 445

(51) Int. Cl.⁷ .................................................. G01V 3/00
(52) U.S. Cl. ........................................ 324/307; 324/318
(58) Field of Search ................................ 324/300, 307, 324/309, 318, 322

(56) References Cited

U.S. PATENT DOCUMENTS

| | | | |
|---|---|---|---|
| 4,825,162 A | | 4/1989 | Roemer et al. |
| 5,160,891 A | | 11/1992 | Keren |
| 5,185,573 A | * | 2/1993 | Larson, III ................... 324/309 |
| 5,221,900 A | * | 6/1993 | Larson, III ................... 324/307 |
| 5,319,309 A | * | 6/1994 | den Boef et al. ............ 324/309 |
| 5,374,890 A | * | 12/1994 | Zou et al. .................... 324/318 |
| 5,399,970 A | * | 3/1995 | Pelc et al. .................... 324/309 |
| 5,471,142 A | | 11/1995 | Wang |
| 5,910,728 A | * | 6/1999 | Sodickson ................... 324/309 |
| 5,951,474 A | * | 9/1999 | Matsunaga et al. .......... 600/422 |
| 5,955,920 A | | 9/1999 | Reudink et al. |
| 6,289,232 B1 | * | 9/2001 | Jakob et al. ................. 600/410 |
| 6,323,648 B1 | * | 11/2001 | Belt et al. .................... 324/322 |
| 6,351,124 B1 | * | 2/2002 | Vester et al. ................. 324/318 |
| 6,366,092 B1 | * | 4/2002 | Ehnholm et al. ............ 324/309 |
| 6,377,044 B1 | * | 4/2002 | Burl et al. .................... 324/307 |
| 6,501,274 B1 | * | 12/2002 | Ledden ........................ 324/318 |
| 6,556,010 B2 | * | 4/2003 | Van Den Brink et al. .. 324/309 |
| 6,591,128 B1 | * | 7/2003 | Wu et al. ..................... 600/422 |

FOREIGN PATENT DOCUMENTS

| | | |
|---|---|---|
| EP | 0 256 520 | 2/1988 |
| EP | 0 412 824 | 2/1991 |
| EP | 1 146 348 | 10/2001 |

OTHER PUBLICATIONS

United States patent application publication 2002/0011843.

* cited by examiner

Primary Examiner—Diego Gutierrez
Assistant Examiner—Dixomara Vargas
(74) Attorney, Agent, or Firm—Schiff Hardin LLP

(57) ABSTRACT

A number of antenna elements of an antenna array for a magnetic resonance system supply respective reception signals from a reception volume. The reception signals are combined with one another in a basic combination and in a number of auxiliary combinations that are orthogonal to one another and contain components derived from isodirectionally circularly polarized magnetic resonance signal components of the magnetic resonance reception signals. At least two combinations are utilized for the image reconstruction.

26 Claims, 4 Drawing Sheets

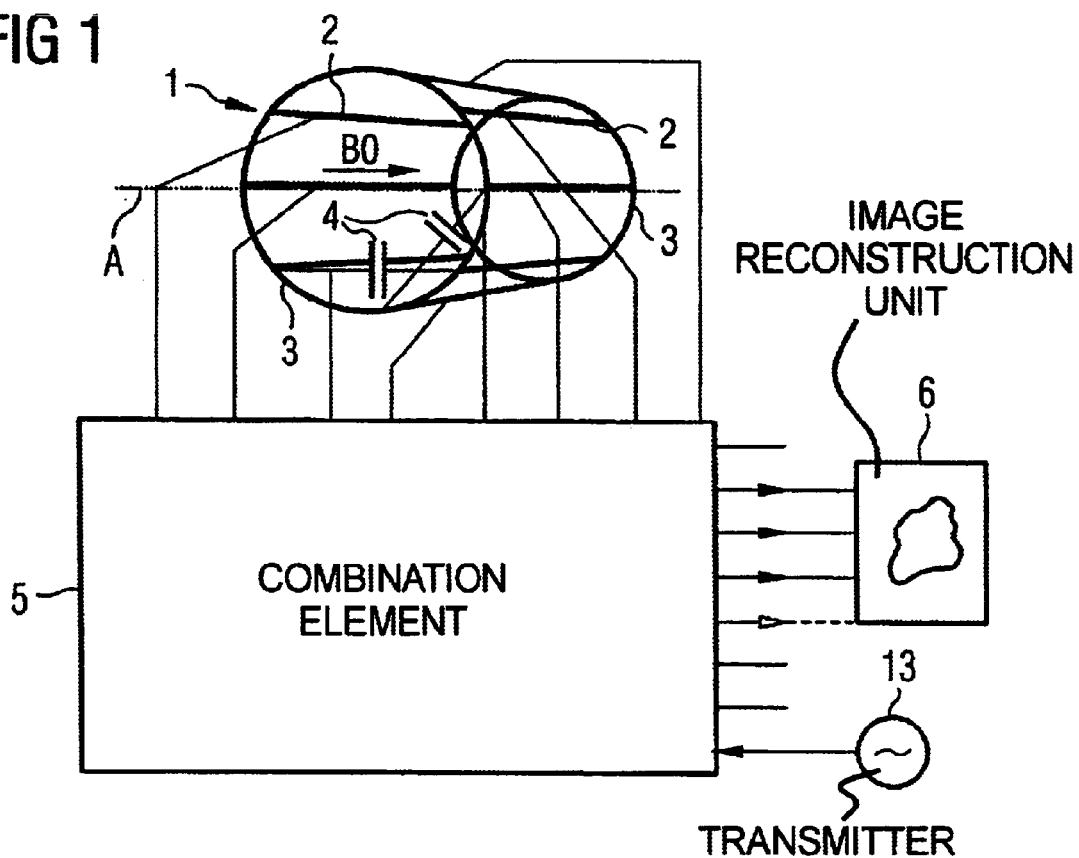

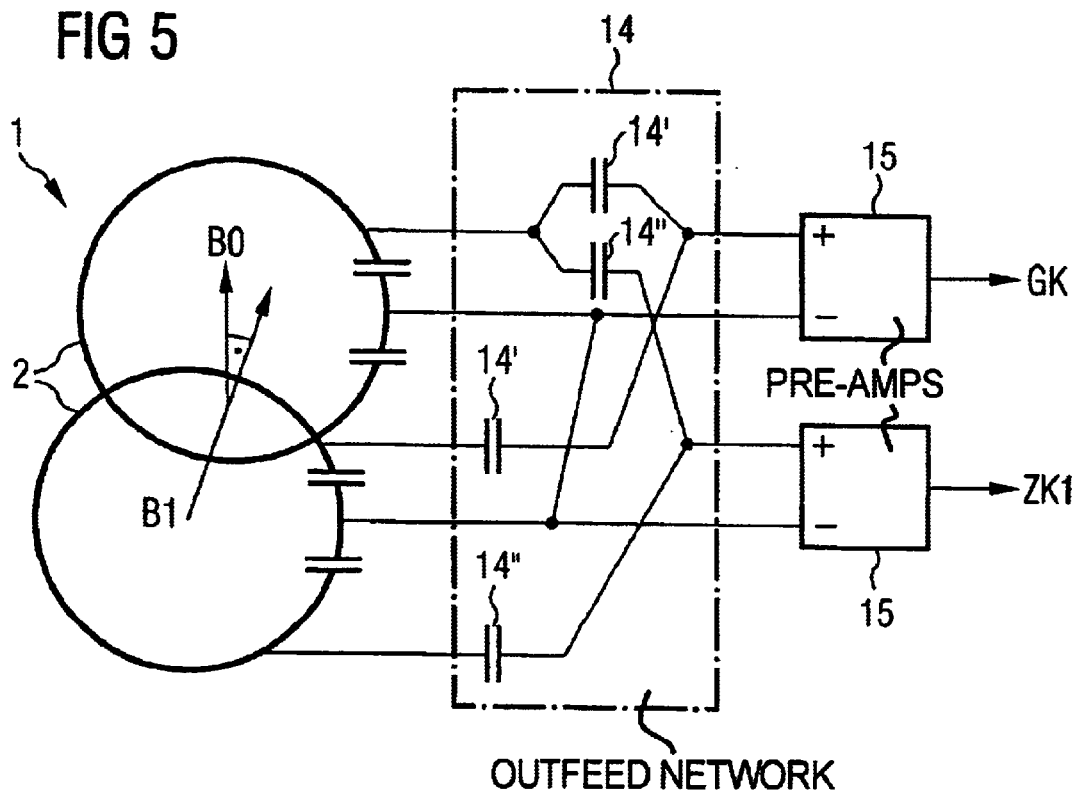
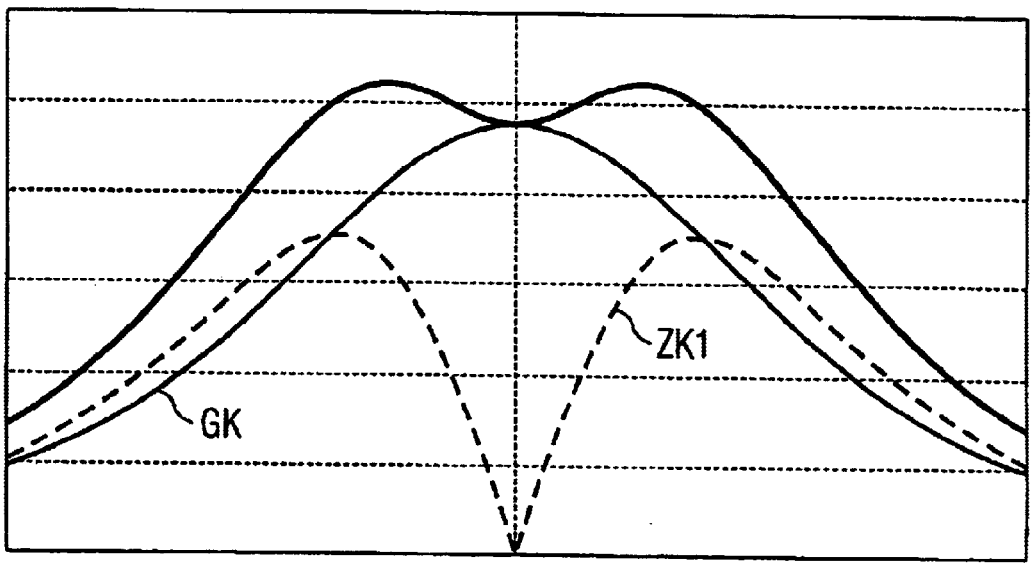

US 6,768,302 B2

MAGNETIC RESONANCE SIGNAL EVALUATION METHOD AND APPARATUS USING COMBINATIONS OF SIMULTANEOUSLY RECEIVED ANTENNA SIGNALS

BACKGROUND OF THE INVENTION

1. Field of the Invention

The present invention is directed to a magnetic resonance signal evaluation method of the type wherein reception signals are simultaneously supplied from a reception volume by a number of antenna elements of an array antenna for a magnetic resonance apparatus, wherein the reception signals are combined with one another in a basic combination, so that the basic combination reproduces a circularly polarized magnetic resonance signal, and wherein the basic combination is utilized for image reconstruction.

The present invention also is directed to a reception arrangement for a magnetic resonance apparatus of the type having an array antenna with a number of antenna elements with which reception signals are simultaneously received from a reception volume, wherein the reception signals are supplied to a combination element with which the reception signals are combined with one another in a basic combination that reproduces a circularly polarized magnetic resonance signal, and wherein the basic combination is supplied to an image reconstruction element that utilizes the basic combination for image reconstruction.

2. Description of the Prior Art

Signal evaluation methods and corresponding reception arrangements of the type are well known. In particular, antennas referred to as birdcage resonators and loop-butterfly elements operate according to this principle.

A very good signal-to-noise ratio is generally required in the evaluation of magnetic resonance signals. In order to achieve this good signal-to-noise ratio, it is known to evaluate a number of reception signals.

SUMMARY OF THE INVENTION

An object of the present invention is to provide a signal evaluation method and a reception arrangement corresponding therewith with which an optimum signal-to-noise ratio can be achieved with as little outlay as possible.

This object is achieved in accordance with the invention in an evaluation method of the above type wherein the reception signals are also combined with one another in a number of auxiliary combinations, with all combinations being orthogonal to one another and wherein the auxiliary combinations contain components derived from circularly polarized magnetic resonance signal components of the magnetic resonance reception signals that are oriented isodirectionally to the basic combination, and wherein at least two combinations are utilized for the image reconstruction.

This object is achieved in accordance with the invention in a reception arrangement of the above type wherein the combination element also combines the reception signals with one another in a number of auxiliary combinations, the combinations being orthogonal to one another, with the auxiliary combinations containing circularly polarized magnetic resonance signal components that are oriented isodirectionally to the basic combination, the combinations being supplied to an image reconstruction unit, and wherein at least one of the auxiliary combination is utilized by the image reconstruction unit for image reconstruction in addition to the basic combination.

The noise in the individual combinations is uncorrelated due to the orthogonally of the combinations. The individual combinations thus can be quadratically added without difficulty. The orthogonality of two combinations is defined in that they satisfy the equation $$\int \sigma E1 E2 dV = 0$$

within the reception volume, wherein $\sigma$ is the conductivity of human tissue and E1 and E2 are the electrical fields induced by the respective antenna elements of one of the combinations if the antenna elements were transmitting.

The combinations usually exhibit reception sensitivities that differ from one another. The signal-to-noise ratio therefore can be optimized when the combinations are utilized for the image reconstruction weighted with their respective reception sensitivities.

When the basic combination exhibits a reception sensitivity differing from zero in the center of the reception volume, a good image reconstruction results, particularly in the center of the reception volume. When the basic combination exhibits a substantially spatially independent reception sensitivity in the reception volume, then an image reconstruction over the entire reception volume is always possible, even independently of the number of auxiliary combinations utilized for the image reconstruction.

The auxiliary combinations usually exhibit a reception sensitivity of zero in the center of the reception volume. This means the edge regions of the reception volume can be reconstructed well with the respective combinations. This is especially true when the auxiliary combinations exhibit a radially increasing reception sensitivity in the reception volume with reference to a symmetry axis. The reception sensitivity of one of the auxiliary combinations should increase essentially linearly with the distance of the observed location from the symmetry axis.

For example, the reception signals can be azimuthally acquired with reference to a basic magnetic field direction. In this case, at least four reception signals must be acquired.

It is also possible to longitudinally acquire the reception signals with reference to a basic magnetic field direction or a radiofrequency field direction. In these cases, it suffices when at least two reception signals are acquired.

The antenna elements should be resonant at the Larmor frequency for all combinations utilized for the image reconstruction. It is therefore required that the antenna elements be inductively-capacitatively decoupled from one another in pairs. The inductive-capacitative decoupling can be achieved, for example, by providing the antenna array with a capacitor network for this purpose.

The combination element can be fashioned as a Butler matrix, allowing it to be realized in an especially simple way.

The reception arrangement can have a transmitter allocated to it that is connected to the antenna elements via a distributor element, and a transmission signal emitted by the transmitter can be divided among the antenna elements by the distributor element so that a magnetic resonance excitation signal is fed into the reception volume, so a subject arranged in the reception volume can be excited to magnetic resonance with the array antenna.

The distributor element can be a component of the Butler matrix, making the structure of the distributor element especially simple.

When the magnetic resonance excitation signal has an essentially location-independent excitation intensity in the reception volume, essentially the entire reception volume is exposed to the magnetic resonance excitation signal.

DESCRIPTION OF THE DRAWINGS

FIG. 1 schematically illustrates a reception arrangement for a magnetic resonance system in accordance with the invention.

FIG. 2 illustrates a combination element in accordance with the invention.

FIG. 5 schematically illustrates a further reception arrangement for a magnetic resonance system in accordance with the invention.

FIG. 6 illustrates further weighting functions in accordance with the invention.

DESCRIPTION OF THE PREFERRED EMBODIMENTS

Figure 3:
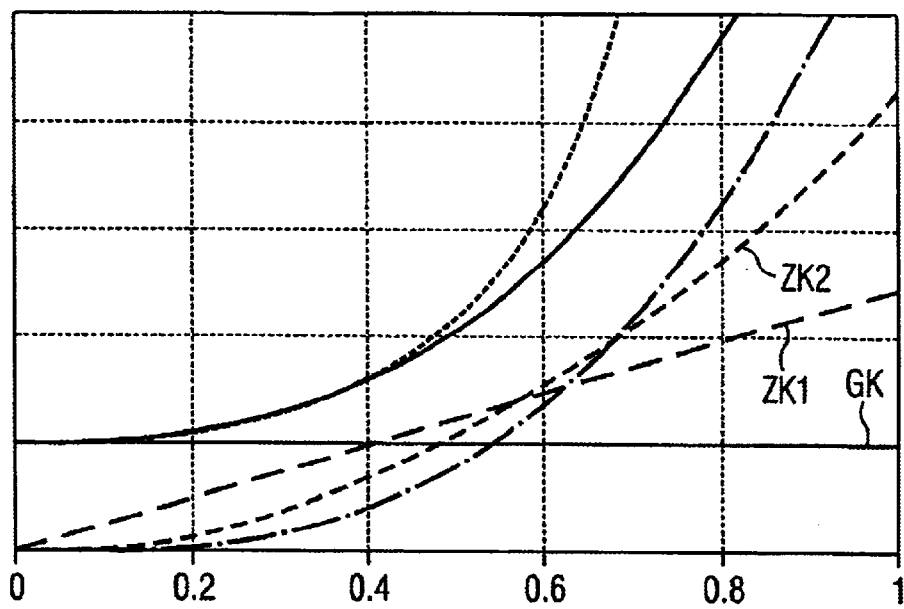
FIG. 3 illustrates weighting factors for combinations in accordance with the invention.

As shown in FIG. 1, a reception arrangement for a magnetic resonance system has an array antenna 1 having a number of antenna elements 2. The array antenna according to FIG. 1 is fashioned as a birdcage resonator. The antenna elements 2 are formed by the cage bars of the birdcage resonator that proceed parallel to one another. As can be seen, they are azimuthally arranged relative to a basic magnetic field direction B0.

As also shown in FIG. 1, the array antenna 1 has, for example, eight antenna elements 2 that are arranged around a symmetry axis A. Fundamentally, however, it could have more or fewer antenna elements 2. Due to the number of antenna elements 2 and their arrangement, thus, at least four reception signals are azimuthally acquired according to FIG. 1 with reference to a basic magnetic field direction B0 that is parallel to the symmetry axis A.

According to FIG. 1, the antenna elements 2 are connected to one another by terminator rings 3. The cylinder that is formed in this way defines a reception volume from which the antenna elements 2 receive their reception signals.

Capacitors that serve for the resonance tuning of the antenna elements 2 usually are arranged in the antenna elements 2 and/or terminator rings 3. These capacitors have not been shown in FIG. 1 for clarity. Two capacitors 4 of a capacitor network, however, are shown. These two capacitors 4 and the remaining capacitors of the capacitor network cause antenna elements 2 that do not directly neighbor one another to be inductively-capacitively decoupled from one another. All antenna elements 2 thus can be inductively-capacitatively decoupled from one another in pairs regardless of whether they are directly adjacent to one another.

The reception signals respectively simultaneously received by the antenna elements 2 are supplied to a combination element 5. The combination element 5 is thereby fashioned as what is referred to as a Butler matrix, formed by a number of delay elements and addition elements. A sum of all reception signals is present at the output of each row of the Butler matrix of the combination element 5, with each reception signal being supplied to a column of the Butler matrix of the combination element 5 and being subjected to a column-specific and row-specific delay.

The delays of the individual matrix elements with reference to the Larmor frequency are shown in FIG. 2. As can be seen, the delays correspond to an analog Fourier development of the reception signals.

The combination element 5 thus forms a number of combinations of the reception signals. The phase delays indicated in FIG. 2 assure that all combinations are orthogonal to one another. The combination allocated to the uppermost row of the Butler matrix of the combination element 5 does not yield a usable signal. The combinations at the rows 2 through 4 are (purely) isodirectionally circularly polarized. The combination at the fifth row is linearly polarized. It thus (still) contains a magnetic resonance signal component that is circularly polarized isodirectionally with the combinations at the rows 2 through 4. The combinations at the last three rows are again circularly polarized isodirectionally to one another but are oppositely circularly polarized relative to the combinations of rows 2 through 4.

The combination at the second row of the Butler matrix of the combination element 5—referred to below as the basic combination GK—exhibits an essentially location-independent (homogeneous) reception sensitivity. Particularly in the center of the reception volume, it thus likewise exhibits a reception sensitivity differing from zero. The reception sensitivity of the basic combination GK is entered in FIG. 3.

The combination at row 3—referred to below as the first auxiliary combination ZK1—exhibits a reception sensitivity that increases essentially linearly proceeding radially inwardly to radially outwardly in the reception volume with reference to the symmetry axis A. The reception sensitivity of the first auxiliary combinations ZK1 amounts to zero in the center of the reception volume. The reception sensitivity of the first auxiliary combination is indicated in FIG. 3.

The combination that can be obtained at row 4—called the second auxiliary combination ZK2 below—exhibits a reception sensitivity that increases essentially quadratically proceeding radially inwardly to radially outwardly in the reception volume. It thus also exhibits a reception sensitivity of zero in the center of the reception volume. The reception sensitivity of the second auxiliary combination ZK2 is also shown in FIG. 3.

The combination in row 5 also can be utilized, the reception sensitivity thereof increasing cubically proceeding radially inwardly to radially outwardly. In the present instance wherein only eight antenna elements are employed, however, this combination is not a purely circularly polarized magnetic resonance signal.

Figure 4:
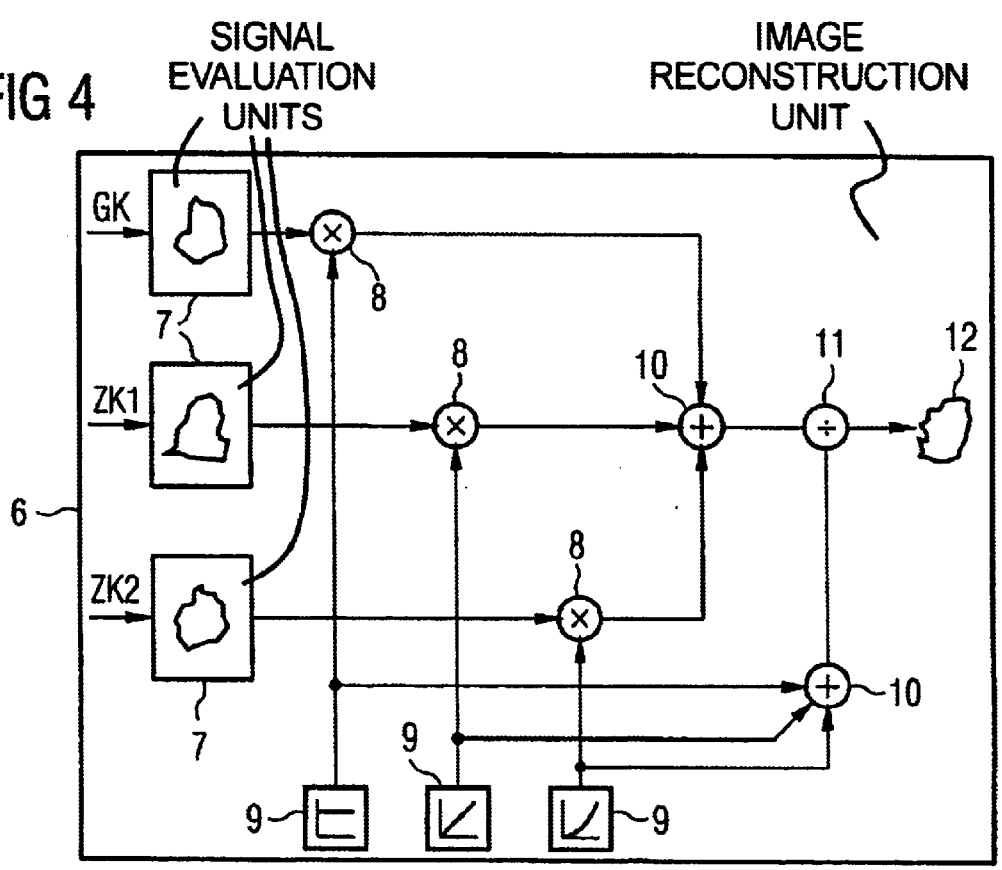
FIG. 4 illustrates an image reconstruction element in accordance with the invention.

The basic combinations GK and the two auxiliary combinations ZK1, ZK2 are supplied to an image reconstruction element 6 that is shown in detail in FIG. 4. This utilizes the basic combination GK and the two auxiliary combinations ZK1, Zk2 for the image reconstruction.

In the image reconstruction element 6, the individual combinations GK, ZK1, ZK2 are supplied to signal evaluation units 7 according to FIG. 4. In a known way, the signal evaluation units 7 reconstruct respective images of a subject arranged in the reception volume. The output signals of the signal evaluation units 7 are supplied to multiplication units 8, to which the output signals of weighting function generators 9 also are supplied. The weighting function generators 9 respectively supply output signals that are proportional to the reception sensitivities shown in FIG. 3. In the following addition units 10 and the division unit 11, the normalized average of the correspondingly weighted, individual image reconstructions is then determined and output as an overall image 12. Thus the combinations GK, ZK1, ZK2 are utilized for the image reconstruction weighted with their respective reception sensitivities.

As already mentioned, the lower three rows of the Butler matrix of the combination element 5 are in fact circularly polarized signals; however, they have the wrong rotational sense for the reception. Nonetheless, utilization of the lower rows of the Butler matrix of the combination element 5 is also possible. For example, the reception arrangement can have a transmitter 13 allocated to it whose signal is supplied into a row of the Butler matrix of the combination element 5. In this case, the Butler matrix of the combination element 5 acts as distributor element for a transmission signal emitted by the transmitter 13. A feed into one of the lower three rows of the Butler matrix of the combination element 5 causes the Butler matrix of the combination element 5 to divide the transmission signal among the antenna elements 2 such that a magnetic resonance excitation signal is supplied into the reception volume. Given a feed into the lowest row, a magnetic resonance excitation signal having an essentially location-independent excitation intensity is thereby generated in the reception volume.

The procedure described above in conjunction with antenna elements 2 arranged azimuthally relative to the basic magnetic field direction B0 also can be employed when the antenna elements 2 are arranged longitudinally relative to the basic magnetic field direction B0 or a radiofrequency field direction B1.

A reception arrangement wherein the reception signals are longitudinally acquired relative to the radiofrequency field direction B1 is shown in FIG. 5. Differing from the embodiment according to FIGS. 1 through 4, only at least two antenna elements 2 whose reception signals are acquired are required in this case.

The outfeed network 14 shown in FIG. 5 likewise makes orthogonal combinations available that both contain isodirectionally circularly polarized magnetic resonance signal components. The combinations are supplied to pre-amplifiers 15. The combination supplied to the upper pre-amplifier 15—referred to as the Helmholtz mode—corresponds to the basic combination GK. Its reception sensitivity is shown in FIG. 6. The combination supplied to the lower pre-amplifier 15—referred to as the "counter-rotating current mode" (also see European Patent 0 256 520)—corresponds to the first and only auxiliary combination ZK1. The reception sensitivity of this combination ZK1 is likewise shown in FIG. 6. The overall sensitivity is also shown.

The Helmholtz mode and the counter-rotating current mode are supplied to the pre-amplifiers 15 via the outfeed network 14 and its capacitors 14', 14", also functioning as an impedance converter. The capacitors 14' have capacitance values that are identical to one another, as do the capacitors 14". The capacitance values of the capacitors 14', however, are higher than those of the capacitors 14". As a result, the respective transformation behaviors for the two modes may differ from one another. The outfeed network 14 thus also acts as a mode-specific matching circuit 14.

Figure 7:
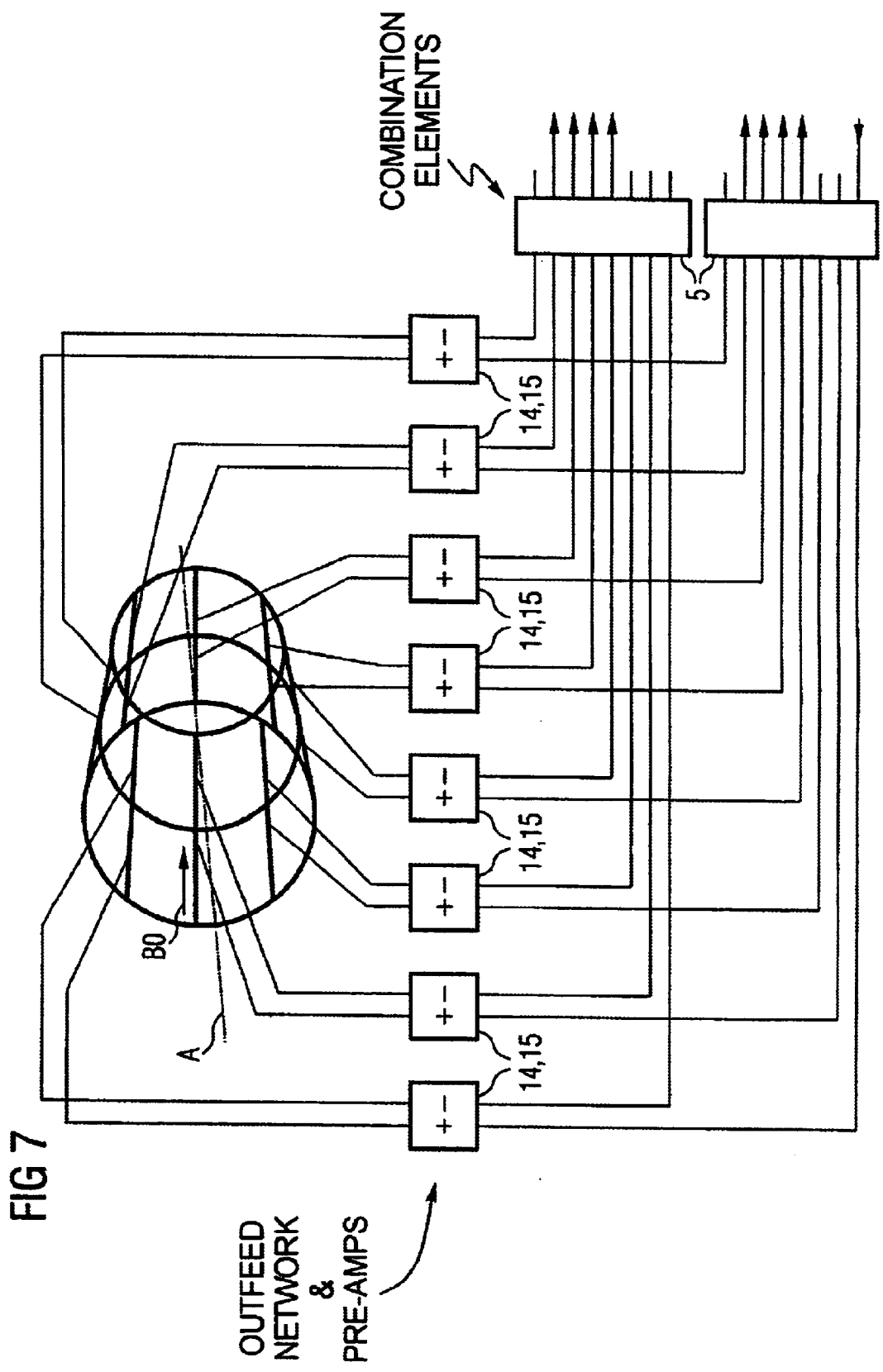
FIG. 7 schematically illustrates a further reception arrangement in accordance with the invention.

FIG. 7 schematically shows a further embodiment. In this case, a birdcage resonator longitudinally divided in two with respectively eight cage bars is employed. As a result of the preceding outfeed networks 14 with following pre-amplifiers 15, a Helmholtz mode and a counter-rotating current mode are formed for each cage bar pair arranged longitudinally following one another. The corresponding azimuthally modes are then formed by the following Butler matrices of the respective combination elements 5. With respect to the formation of the Helmholtz mode and the counter-rotating current mode, the antenna elements 2 in the embodiment according to FIG. 7 are longitudinally arranged relative to the basic magnetic field direction B0).

The present invention enables an optimum image reconstruction with the fewest possible number of signal evaluation units 7.

In particular, it is possible to always provide the outfeed networks 14 plus following addition units 15 and the Butler matrices of the combination elements 5 and to utilize the signal evaluation units 7 following the Butler matrices of the combination elements 5, as needed. Dependent on the requirements of the individual case, for example, only the basic combination GK or only the basic combination GK and the first auxiliary combination ZK1 or the basic combination GK and both auxiliary combinations ZK1, ZK2 can be evaluated. The third auxiliary combination ZK3 that yields only a linearly polarized magnetic resonance signal can be utilized as warranted for the image reconstruction.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance signal evaluation method comprising the steps of:

simultaneously receiving a plurality of magnetic resonance reception signals, originating in a reception volume, respectively with a plurality of antenna elements of an array antenna, said magnetic resonance reception signals containing isodirectionally circularly polarized magnetic resonance signal components;

combining said reception signals with each other in a basic combination and in at least one of auxiliary combination, each of said basic combination and said at least one auxiliary combination being orthogonal to each other and respectively containing components derived from said isodirectionally circularly polarized magnetic resonance signal components; and reconstructing an image of at least a portion of said reception volume using at least two of said basic combination and said at least one auxiliary combination.

2. A signal evaluation method as claimed in claim 1 wherein said basic combination and said at least one of auxiliary combination have reception sensitivities which respectively differ from each other, and wherein the step of reconstructing said image comprises respectively weighting the combinations in said at least two of said basic combination and said at least one auxiliary combination dependent on the respective reception sensitivities of said basic combination and said at least one auxiliary combination.

3. A signal evaluation method as claimed in claim 1 wherein said basic combination exhibits a non-zero reception sensitivity at a center of said reception volume.

4. A signal evaluation method as claimed in claim 3 wherein said basic combination exhibits a substantially location-independent sensitivity in said reception volume.

5. A signal evaluation method as claimed in claim 1 wherein each of said at least one auxiliary combination exhibits a reception sensitivity of zero in a center of said reception volume.

6. A signal evaluation method as claimed in claim 5 wherein each of said at least one auxiliary combination exhibits a radially increasing reception sensitivity in said sensitivity volume relative to a symmetry axis.

7. A signal evaluation method as claimed in claim 6 wherein the reception sensitivity of the at least one auxiliary combinations increase linearly in said reception volume.

8. A signal evaluation method as claimed in claim 1 wherein the step of receiving said magnetic resonance reception signals comprises azimuthally acquiring at least four magnetic resonance reception signals with respect to a basic magnetic field direction.

9. A signal evaluation method as claimed in claim 1 wherein the step of receiving said magnetic resonance reception signals comprises longitudinally acquiring at least two magnetic resonance reception signals with respect to a field direction selected from the group consisting of a basic magnetic field direction and a radio frequency field direction.

10. A signal evaluation method as claimed in claim 9 comprising employing a matching circuit to transform said basic combination and said plurality of auxiliary combinations differently from each other.

11. A reception arrangement for a magnetic resonance system comprising:
   an array antenna having a plurality of antenna elements which respectively simultaneously emit magnetic resonance reception signals received from a reception volume, said magnetic resonance reception signals containing isodirectionally circularly polarized magnetic resonance signal components;
   a combination element supplied with said reception signals and which forms, from said reception signals, a basic combination and at least one auxiliary combination, each of said basic combination and said at least one auxiliary combination being orthogonal to each other and respectively containing components derived from said isodirectionally circularly polarized magnetic resonance signal components; and
   an image reconstruction unit supplied with said basic combinations and said at least one auxiliary combination for reconstructing an image of at least a portion of said reception volume from said basic combination and said at least one auxiliary combination.

12. A reception arrangement as claimed in claim 11 wherein said basic combination and said at least one auxiliary combination respectively exhibit reception sensitivities that differ from each other, and wherein said image reconstruction unit respectively weights said basic combination and said at least one auxiliary combination dependent on their respective reception sensitivities.

13. A reception arrangement as claimed in claim 12 wherein said reception sensitivity of said basic combination is non-zero at a center of said reception volume.

14. A reception arrangement as claimed in claim 13 wherein said reception sensitivity of said basic combination is substantially location-independent in said reception volume.

15. A reception arrangement as claimed in claim 11 wherein each of said at least one auxiliary combination exhibits a reception sensitivity of zero at a center of said reception volume.

16. A reception arrangement as claimed in claim 15 wherein the reception sensitivity of said at least one auxiliary combination increases radially in said reception volume relative to a symmetry axis.

17. A reception arrangement as claimed in claim 16 wherein the reception sensitivity of said at least one auxiliary combinations increases linearly in said reception volume.

18. A reception arrangement as claimed in claim 11 wherein said plurality of antenna elements is at least four, and wherein said at least four antenna elements are arranged azimuthally relative to a basic magnetic field direction.

19. A reception arrangement as claimed in claim 11 wherein said magnetic resonance system operates with a radio frequency field having a radio frequency field direction and a basic magnetic field having a basic magnetic field direction, wherein said plurality of antenna elements is at least two, and wherein a first of said at least two antenna elements is longitudinally arranged relative to a direction selected from the group consisting of said radio frequency field direction and said basic magnetic field direction and wherein a second of said at least two antenna elements is longitudinally arranged relative to a direction selected from the group consisting of said radio frequency field direction, and said basic magnetic field direction.

20. A reception arrangement as claimed in claim 19 further comprising a matching circuit connected between said array antenna and said combination unit for differently transforming the respective reception signals from said first of said at least two antenna elements and said second of said at least two antenna elements.

21. A reception arrangement as claimed in claim 11 further comprising decoupling elements for inductive-capacitive decoupling between pairs of said antenna elements.

22. A reception arrangement as claimed in claim 21 wherein said decoupling elements form a capacitor network for said inductive-capacitive decoupling of said pairs of antenna elements.

23. A reception arrangement as claimed in claim 11 wherein said combination element is a Butler matrix.

24. A reception arrangement as claimed in claim 11 further comprising a transmitter connected to said antenna elements via a distributor element, said transmitter emitting a transmission signal that is divided among said antenna elements by said distributor element to radiate a magnetic resonance excitation signal into said reception volume.

25. A reception arrangement as claimed in claim 24 wherein said combination element is a Butler matrix, and wherein said distributor element is a component of said Butler matrix.

26. A reception arrangement as claimed in claim 24 wherein said antenna elements radiate a magnetic resonance excitation signal in said examination volume that is substantially location-independent with respect to sensitivity in said reception volume.

* * * * *